United States Patent
Choi et al.

(10) Patent No.: US 6,524,753 B2
(45) Date of Patent: Feb. 25, 2003

(54) METHOD FOR MANUFACTURING PHASE SHIFT MASK

(75) Inventors: Sang-Tae Choi, Ichon-shi (KR); Hwan-Soo Jang, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/740,926

(22) Filed: Dec. 21, 2000

(65) Prior Publication Data

US 2001/0027027 A1 Oct. 4, 2001

(30) Foreign Application Priority Data

Dec. 29, 1999 (KR) ................................ 10-1999-0065180

(51) Int. Cl.[7] .............................. G03F 9/00; G03C 5/00
(52) U.S. Cl. ............................ 430/5; 430/296; 430/322
(58) Field of Search ............................ 430/5, 322, 394, 430/296

(56) References Cited

U.S. PATENT DOCUMENTS 5,543,253 A * 8/1996 Park et al. ..................... 430/5

* cited by examiner

Primary Examiner—S. Rosasco
(74) Attorney, Agent, or Firm—Finnegan, Henderson, Farabow, Garrett & Dunner, L.L.P.

(57) ABSTRACT

A method for manufacturing a phase shift mask includes the steps of forming a shift layer, a metal layer and a photoresist layer on a substrate subsequently, patterning the photoresist layer into a predetermined configuration, thereby obtaining a first, a second, a third and a fourth photoresist patterns, forming a chemical swelling process (CSP) chemical layer on the photoresist patterns and an exposed portion of the substrate, patterning the CSP chemical layer using masks over the first and the fourth photoresist patterns, whereby the CSP chemical layer on the first and the fourth photoresist patterns remains thereon, patterning an exposed portion of the metal layer into the predetermined configuration using the second and the third photoresist patterns as masks, patterning the exposed portions of the shift layer into the predetermined configuration, and removing the first and fourth photoresist patterns.

5 Claims, 9 Drawing Sheets

METHOD FOR MANUFACTURING PHASE SHIFT MASK

FIELD OF THE INVENTION

The present invention relates to a semiconductor memory device; and, more particularly, to a method for manufacturing a phase shift mask by employing a chemical layer for a chemical swelling process (CSP) instead of a photoresist layer.

DESCRIPTION OF THE PRIOR ART

Generally, a phase shift mask is used to shift a phase of a light on the mask using an interference effect which reduces a space frequency of a pattern or increases a contrast on a corner. The phase shift mask provides a high resolving power and an increase of a depth of focus (DOF) so that it is possible to fabricate a pattern for use in a device with a high integration.

Referring to FIGS. 1A to 1I, there are provided cross section views setting forth a conventional method for manufacturing the phase shift mask.

The manufacturing steps begin with a preparation of the substrate 110 made of a synthetic quartz. Thereafter, a shift layer 112, a chromium (Cr) layer 114 and a first photoresist layer 116 is formed on top of the substrate 110 subsequently, as shown in FIG. 1A. The chromium layer 114 is formed to a thickness of approximately 1,000 Å including CrOx and the shift layer 112 is formed to the thickness of approximately 950 Å including MoSiN.

In a next step as shown in FIG. 1B, the first photoresist layer 116 is patterned into a first predetermined configuration by using an E-beam or laser beam, thereby obtaining a first photoresist pattern 116A.

In an ensuing step, the chromium layer 114 is patterned into the first predetermined configuration by using a dry etching such as an inductively coupled plasma (ICP) or a reactive ion etching (RIE), or wet etching process such as a spin spray method, so that a patterned chromium layer 114A is obtained, as shown in FIG. 1C. The first photoresist pattern 116A plays a role as an etching mask in post manufacturing steps.

Thereafter, the shift layer 112 is patterned into the first predetermined configuration by using an inductively coupled plasma (ICP), thereby forming a patterned shift layer 112A, as shown in FIG. 1D.

In a subsequent step, as shown in FIG. 1E, the first photoresist pattern 116A is stripped off by using $H_2SO_4/H_2O_2$+SC-1.

In a next step, a second photoresist layer 118 is formed on the patterned chromium layer 114A and the substrate 110, as shown in FIG. 1F.

In an ensuing step, the second photoresist layer 118 is patterned into a second predetermined configuration by using the laser beam, thereby obtaining a second photoresist pattern remaining on the patterned chromium layer 114A which is disposed on each end of the substrate 110 as shown in FIG. 1G.

Thereafter, two patterned chromium layer 114A in the middle of the substrate 110 is removed by using the second photoresist pattern as the etching mask as shown in FIG. 1H.

Finally, the second photoresist pattern 116A remaining on the patterned chromium layer 114A on each end of the substrate is stripped off by using $H_2SO_4/H_2O_2$+SC-1 as shown in FIG. 1I.

As described above, the conventional method for manufacturing the phase shift mask may involve long and tedious steps. That is, formation and removal of the photoresist may be repeated twice thereby increasing the total manufacturing steps.

SUMMARY OF THE INVENTION

It is, therefore, an object of the present invention to provide a method for manufacturing a phase shift mask by employing a chemical swelling process (CSP) chemical layer instead of a photoresist layer, whereby manufacturing steps are shortened.

In accordance with one aspect of the present invention, there is provided a method for manufacturing a phase shift mask, the method comprising the steps of: a) forming a shift layer, a metal layer and a photoresist layer on a substrate subsequently; b) patterning the photoresist layer into a predetermined configuration, thereby obtaining a first, a second, a third and a fourth photoresist pattern; c) forming a chemical swelling process (CSP) chemical layer on the photoresist patterns and an exposed portion of the substrate; d) patterning the CSP chemical layer using masks over the first and the fourth photoresist patterns, whereby the CSP chemical layer on the first and the fourth photoresist patterns remains thereon; e) patterning an exposed portion of the metal layer into the predetermined configuration using the second and the third photoresist patterns as masks; f) patterning the exposed portions of the shift layer into the predetermined configuration; and g) removing the first and fourth photoresist patterns.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Referring to FIGS. 2A to 2H, there are provided cross sectional views setting forth a method for manufacturing a phase shift mask in accordance with a preferred embodiment of the present invention.

Figure 1A:
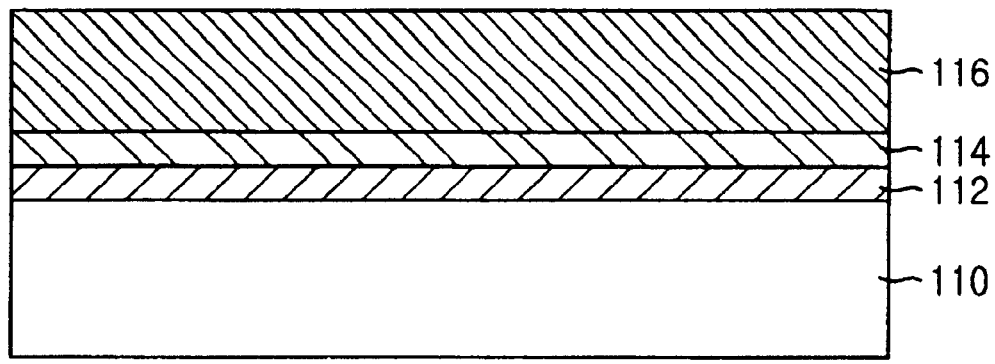
FIGS. 1A, 1B, 1C, 1D, 1E, 1F, 1G, 1H and 1I are cross sectional views setting forth a conventional method for manufacturing a phase shift mask.
Figure 1B:
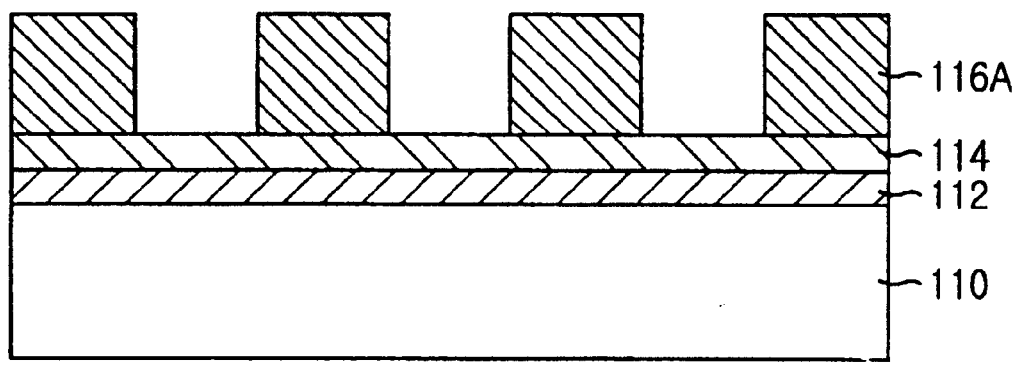
Figure 1C:
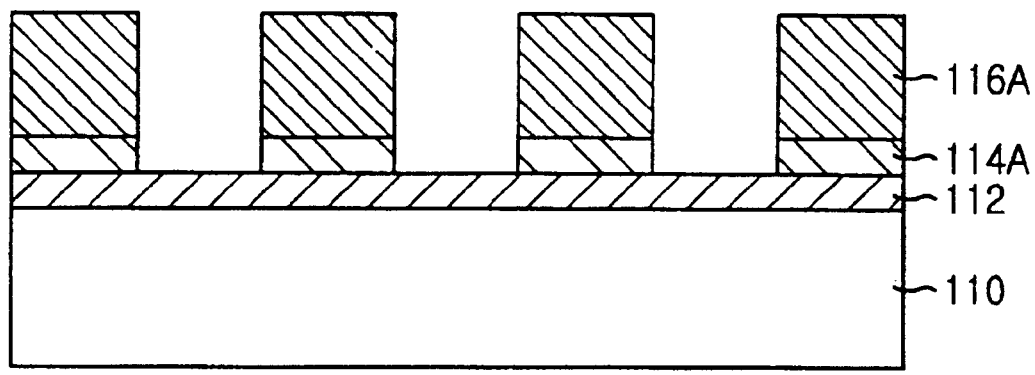
Figure 1D:
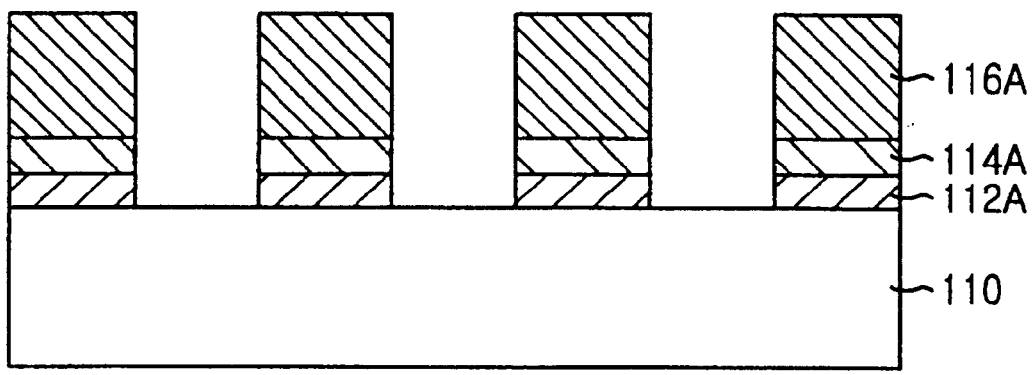
Figure 1E:
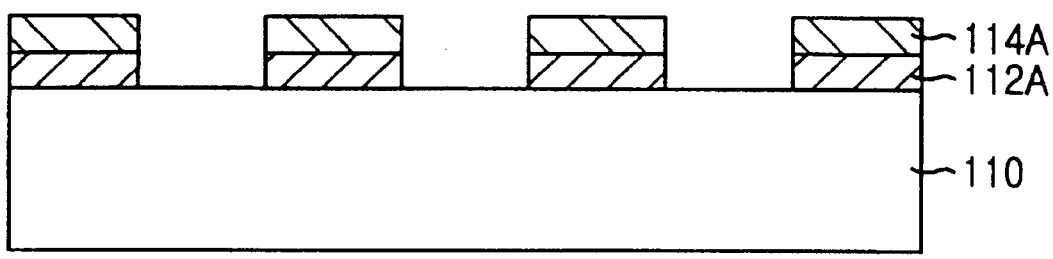
Figure 1F:
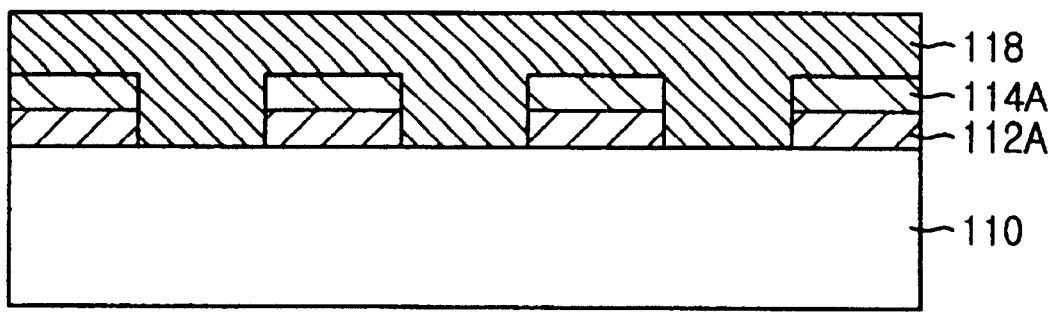
Figure 1G:
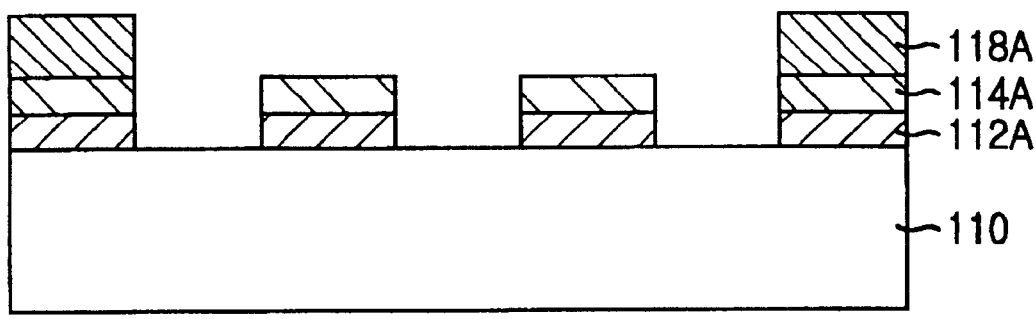
Figure 1H:
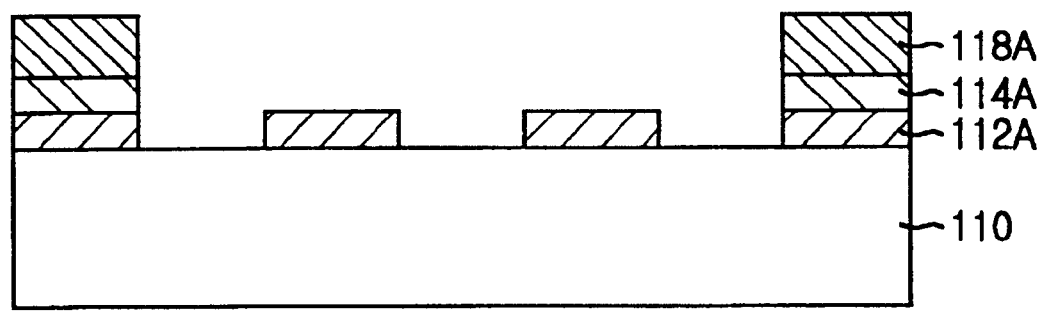
Figure 1I:
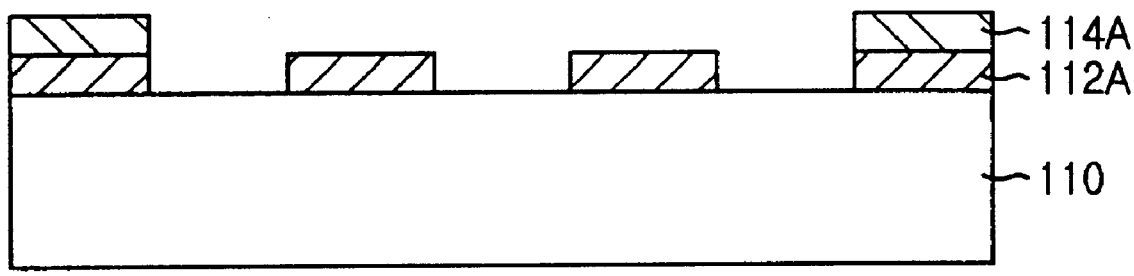
Figure 2A:
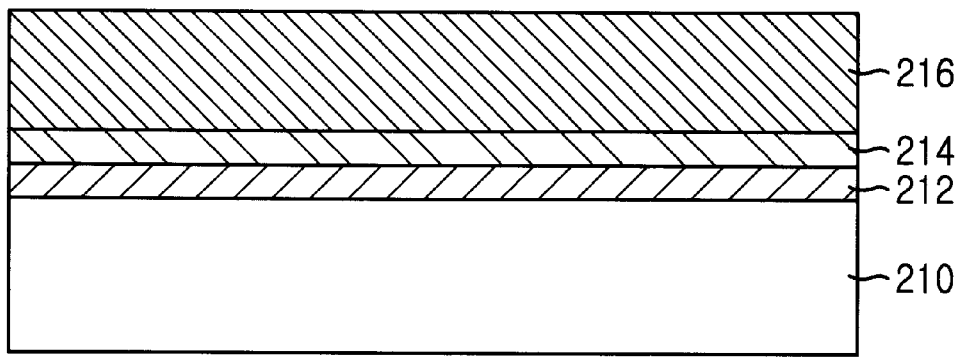
FIGS. 2A, 2B, 2C, 2D, 2E, 2F, 2G and 2H are cross sectional views setting forth a method for manufacturing a phase shift mask in accordance with a preferred embodiment of the present invention.

The manufacturing steps being with a preparation of the substrate 210 made of a synthetic quartz. Thereafter, a shift layer 212, a chromium (Cr) layer 214 and a photoresist layer 216 is formed on top of the substrate 210, subsequently as shown in FIG. 2A. The chromium layer 214 is formed to a thickness of approximately 1,000 Å in a shape of CrOx and the shift layer 212 is formed to the thickness of approximately 950 Å including MoSiN. Taking a chemical swelling process (CSP) of a post step into consideration, it is preferable that the photoresist layer 216 is formed to a thin thickness.

Figure 2B:
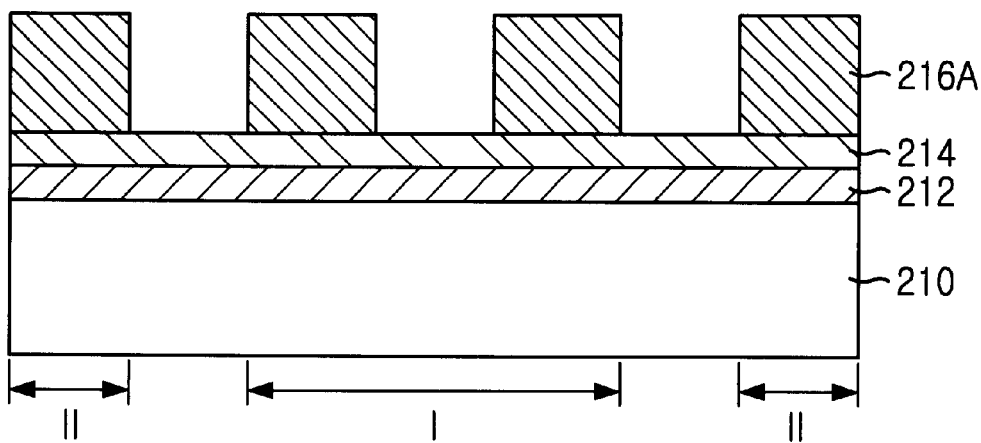

In a next step as shown in FIG. 2B, the photoresist layer 216 is patterned into a predetermined configuration by using an E-beam or laser beam, thereby obtaining a photoresist pattern 216A.

In this step, a first group of photoresist patterns are formed in a first region, in which single layer patterns are to be formed with shift layer 212, and a second group of photoresist patterns are formed in a second region, in which double layer patterns are to be formed with the chromium layer 214 and the shift layer 212.

Figure 2C:
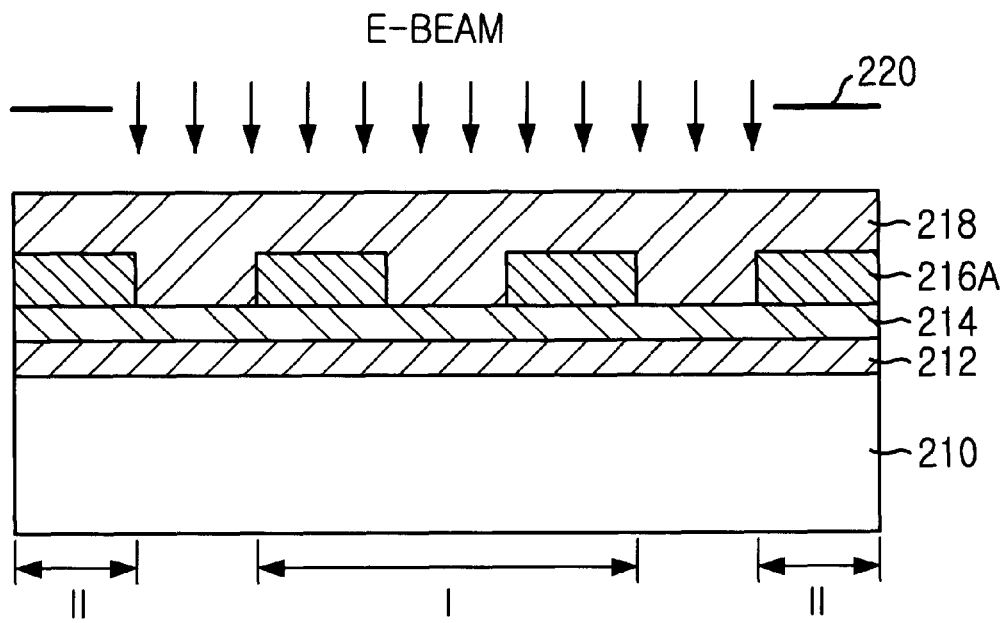

In an ensuing step, a CSP chemical layer 218 is deposited on the photoresist pattern 216A and an exposed portion of the chromium layer 214. And then, an E-beam is impinged on the CSP chemical layer 218 except portions thereof on the photoresist pattern 216A disposed on each end of the substrate 210 using masks 220 as shown in FIG. 2C. The CSP chemical has a characteristic that there is no reaction of the CSP chemical and the photoresist in a portion impinged by an E-beam, but in a portion not impinged by the E-beam, the CSP chemical reacts with the photoresist, thereby increasing the thickness of the photoresist.

Figure 2D:
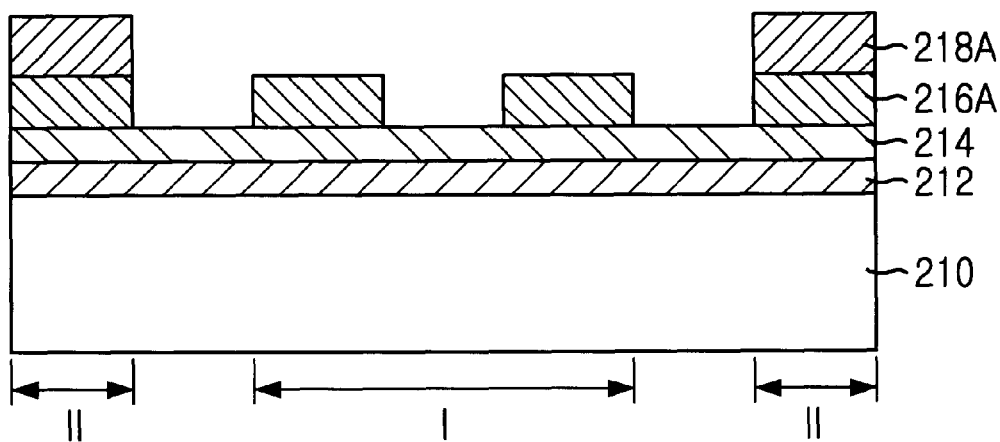

Thereafter, the CSP chemical layer 218 disposed on the portion impinged by the E-beam is removed by rinsing with distilled water. At this time, the portion not impinged by the E-beam is changed into a reacted CSP chemical 218A as shown in FIG. 2D.

Figure 2E:
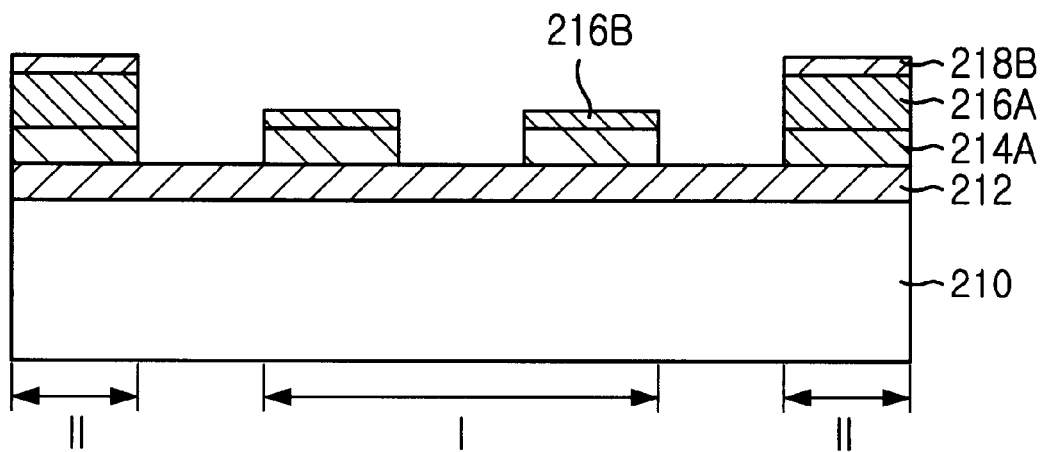

In a next step, the chromium layer 214 is patterned into the predetermined configuration by using a dry or wet etching process so that a patterned chromium layer 214A is obtained as shown in FIG. 2E. At this time, the photoresist pattern 216A in first region I is also removed to a degree while patterning the chromium layer 214 by adjusting a selectivity for the photoresist pattern 216A, thereby leaving a photoresist residue 216B in first region I as shown in FIG. 2E.

Figure 2F:
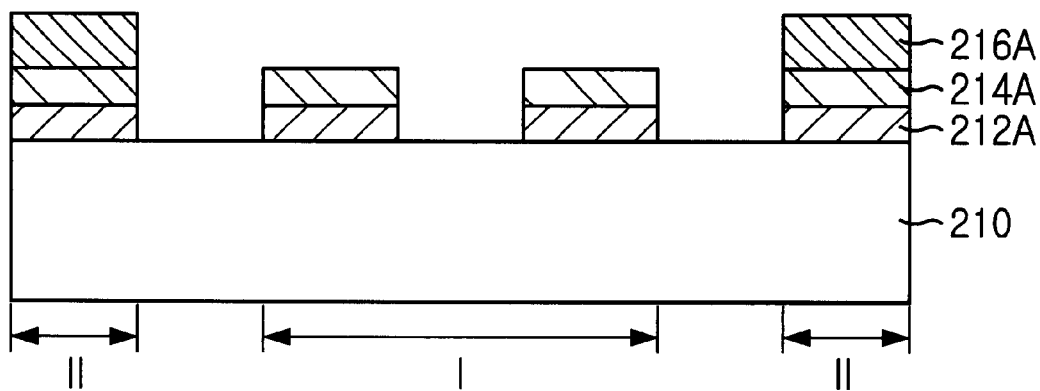

Thereafter, the shift layer 212 is patterned into the predetermined configuration by using an inductively coupled plasma (ICP), thereby forming a pattern shift layer 212A as shown in FIG. 2F. In this step, the photoresist residue 216B is also removed by adjusting the selectivity for the photoresist residue 216B, as shown in FIG. 2E.

Figure 2G:
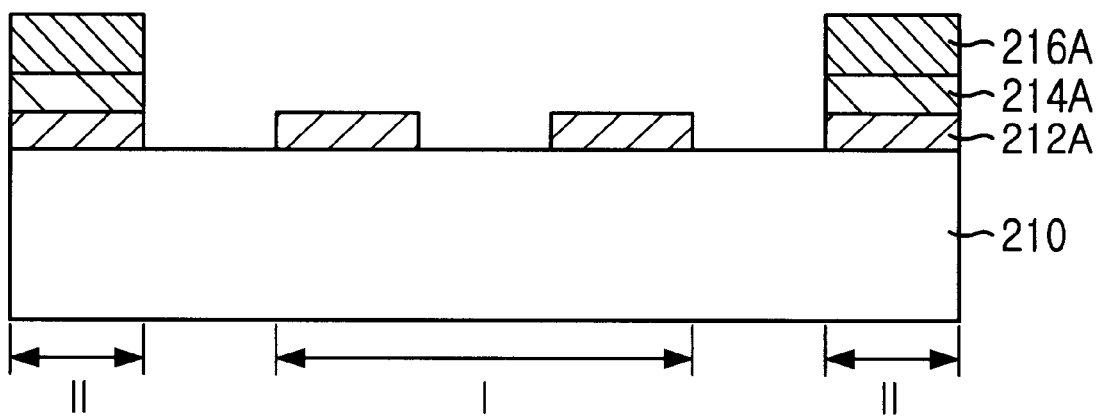

In an ensuing step, the patterned chromium layer 214A in first region I is removed by the etching process as shown in FIG. 2G.

Figure 2H:
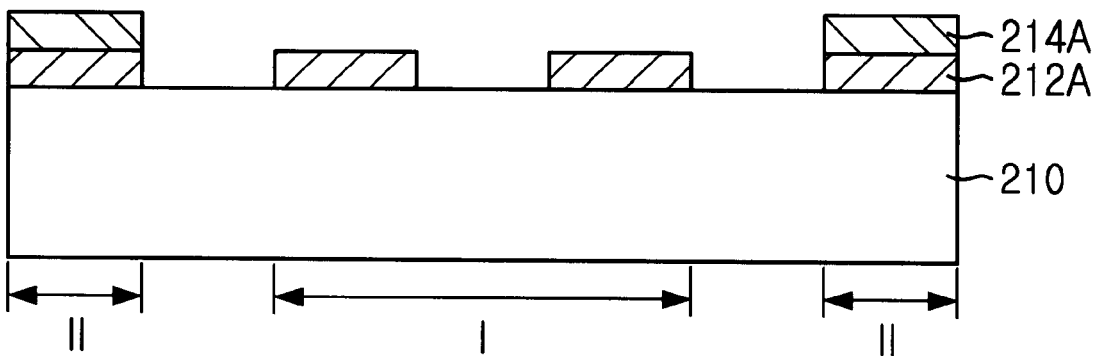

Finally, the photoresist pattern 216A remaining on the patterned chromium layer 214A on each end of the substrate is stripped off by using $H_2SO_4/H_2O_2$+SC-1, as shown in FIG. 2H.

In comparison with a prior art, the steps for manufacturing the phase shift mask in accordance with the present invention is shortened. That is, each step for forming and removing the photoresist layer is performed only one time so that a productivity can be improved and a manufacturing cost can be reduced.

While the present invention has been described with respect to the particular embodiments, it will be apparent to those skilled in the art that various changes and modifications may be made without departing from the scope of the invention as defined in the following claims.

What is claimed is:

1. A method for manufacturing a phase shift mask, comprising the steps of:

forming a shift layer, a metal layer, and a photoresist layer on a substrate in that order;

patterning the photoresist layer into a predetermined configuration having a plurality of photoresist patterns laterally spaced a distance from one another, wherein a first group of photoresist patterns is formed in a first region and a second group of the photoresist patterns is formed in a second region;

forming a chemical swelling process (CSP) chemical layer over the first and second regions, wherein the CSP chemical layer is formed of a material that does not react to the photoresist layer if the material is impinged by an E-beam and reacts to the photoresist layer if the material is not impinged by an E-beam;

impinging an e-beam onto the CSP chemical layer formed over the first region;

removing portions of the CSP chemical layer that are impinged by the E-beam, and obtaining CSP layer patterns in the second region, wherein the metal layer is exposed between the photoresist patterns;

forming metal patterns by patterning the exposed metal layer into the predetermined configuration, wherein some parts of the first group of the photoresist patterns are removed by adjusting a selectivity for the photoresist pattern, and wherein portions of the shift layer are exposed;

patterning the exposed portions of the shift layer into the predetermined configuration, wherein remaining parts of the first group of the photoresist patterns are removed by adjusting a selectivity for the photoresist patterns, and the metal patterns in the first region are exposed;

removing the metal layer in the first region by an etching process; and removing the photoresist patterns and the CSP chemical layer, thereby obtaining single layer patterns formed with the shift layer in the first region and double layer patterns formed with the metal layer and the shift layer.

2. The method as recited in claim 1, wherein the metal layer includes chromium oxide (CrOx) and has a thickness of approximately 1,000 Å.

3. The method as recited in claim 1, wherein the shift layer includes MoSiN and has a thickness of approximately 950 Å.

4. The method as recited in claim 1, said removing CSP chemical layer being carried out by using distilled water.

5. The method as recited in claim 1, wherein the step of removing the photoresist layer is carried out by using $H_2SO_4/H_2O_2$+SC-1.

* * * * *